United States Patent [19]
Block et al.

[11] Patent Number: 5,398,399
[45] Date of Patent: Mar. 21, 1995

[54] PROCESS FOR METALLIZING MONOLITHIC MICROWAVE CERAMIC FILTERS

[75] Inventors: Christian Block, Graz; Sigurd Greiderer, Feldkirchen; Gerhard Peperko, Deutschlandsberg, all of Austria

[73] Assignee: Siemens Matsushita Components GmbH, Munich, Germany

[21] Appl. No.: 114,780

[22] Filed: Aug. 31, 1993

[30] Foreign Application Priority Data

Aug. 31, 1992 [DE] Germany .......... 42 29 001.5

[51] Int. Cl.⁶ .......................................... H01P 11/00
[52] U.S. Cl. .................................... 29/600; 333/206; 333/219
[58] Field of Search .............. 29/600; 333/222, 206, 333/219

[56] References Cited

U.S. PATENT DOCUMENTS 4,751,481  6/1988  Guzik et al. ............... 29/600 X
5,109,207  4/1992  Aizawa et al. ............... 333/222

FOREIGN PATENT DOCUMENTS 3-205903   9/1991  Japan ................... 333/206
3-212003   9/1991  Japan ................... 333/206
4-7904     1/1992  Japan ................... 333/222
4-51602    2/1992  Japan ................... 333/206
4-103202   4/1992  Japan ................... 333/206
1376144    2/1988  U.S.S.R. ............... 333/219

*Primary Examiner*—Carl J. Arbes
*Attorney, Agent, or Firm*—Herbert L. Lerner; Laurence A. Greenberg

[57] ABSTRACT

A monolithic microwave ceramic filter has a ceramic body with an outer surface, resonator bores being formed in the ceramic body and defining surfaces within the resonator bores, and coupling voids being formed in the ceramic body between the resonator bores. A process for metallizing the monolithic microwave ceramic filter includes covering at least the coupling voids with ceramic foil, and subsequently galvanically metallizing the ceramic body to produce a metallizing over at least a portion of the outer surface of the ceramic body and the surfaces within the resonator bores.

6 Claims, 1 Drawing Sheet

PROCESS FOR METALLIZING MONOLITHIC MICROWAVE CERAMIC FILTERS

BACKGROUND OF THE INVENTION

FIELD OF THE INVENTION

The present invention relates to a process for metallizing monolithic microwave ceramic filters having a ceramic body with resonator bores, coupling voids between the resonator bores, and a metallizing over at least a portion of an outer surface of the ceramic body and inner surfaces of the resonator bores.

However, in such metallization, the inner surfaces of the coupling voids must remain free of metallizing. Therefore galvanic metallizing is either not considered as an option, or if the metallizing is carried out galvanically, additional manufacturing expense is involved, because the metallizing is removed again in the coupling voids, for instance by drilling.

For the above reasons, the applicant, like others, has thus far entirely avoided galvanic metallizing and instead has performed the metallizing by using thick-film pastes. Aside from the greater effort and expense metallizing entails, such a provision is disadvantageous with a view toward structuring by screenprinting, because that involves another major expenditure, and positioning of the filter in the metallizing becomes difficult.

SUMMARY OF THE INVENTION

It is accordingly an object of the invention to provide a process for metallizing monolithic microwave ceramic filters, which overcomes the hereinafore-mentioned disadvantages of the heretofore-known methods of this general type and in which the metallizing can be performed galvanically in a simple way.

With the foregoing and other objects in view there is provided, in accordance with the invention, a process for metallizing monolithic microwave ceramic filters having a ceramic body with an outer surface, resonator bores being formed in the ceramic body and defining surfaces within the resonator bores, and coupling voids being formed in the ceramic body between the resonator bores, which comprises covering at least the coupling voids with ceramic platelet, and subsequently galvanically metallizing the ceramic body to produce a metallizing over at least a portion of the outer surface of the ceramic body and the surfaces within the resonator bores.

In accordance with another mode of the invention, there is provided a process which comprises performing the covering step with ceramic platelets being formed of a ceramic having the same dielectric constant as the ceramic body.

In accordance with a further mode of the invention, there is provided a process which comprises applying the ceramic platelets to the coupling voids prior to sintering of the ceramic body and sintering the ceramic platelets together with the ceramic body.

In accordance with an added mode of the invention, there is provided a process which comprises masking the metallizing by additionally applying ceramic platelets to regions of the ceramic body other than at the coupling voids.

In accordance with a concomitant mode of the invention, there is provided a process which comprises grinding at least a portion, for instance an end surface, of the ceramic body free of the metallizing, after performing the metallizing step.

Other features which are considered as characteristic for the invention are set forth in the appended claims.

Although the invention is illustrated and described herein as embodied in a process for metallizing monolithic microwave ceramic filters, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
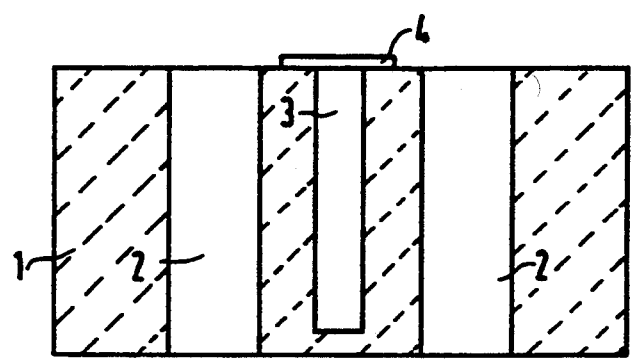
FIG. 1 is a diagrammatic, sectional view of a monolithic microwave ceramic filter produced in accordance with the invention.

Referring now to the figures of the drawing in detail and first, particularly, to FIG. 1 thereof, there is seen a basic sectional view of a monolithic microwave ceramic filter, in which resonator bores 2 are provided in a ceramic body 1, and coupling voids 3 in the form of blind bores are provided between the resonator bores 2 for coupling individual resonators formed by the resonator bores 2. Such a filter must be metallized, in which process a metallizing layer must be produced over at least a portion of the outer surface or outside of the ceramic body 1 and inner surfaces of the resonators 2. The outer surface of the ceramic body 1 may be metallized in such a way that the entire outer surface is metallized except for an end surface, for example an upper end surface as seen in the plan of the drawing. Copper or silver are possible materials for the metallizing.

Inner surfaces of the coupling voids 3 must remain free of metallizing in such a metallization. Galvanic metallizing is therefore either not considered as an option, or if the metallizing is carried out galvanically, additional manufacturing expense is involved, because the metallizing is removed again in the coupling voids 3, for instance by drilling.

According to the invention, prior to metallizing the ceramic body 1 containing the resonator bores 2, the coupling voids 3 are covered with a ceramic platelet 4, which preferably has the same dielectric constant as the ceramic body.

In the course of the production of the monolithic microwave ceramic filters, the ceramic platelets 4 are applied to the coupling voids 3 before the ceramic body 1 is sintered and are sintered together with the ceramic body. Next, the sintered ceramic bodies 1, with the ceramic platelets 4 located on the coupling voids, are galvanically metallized, so that the entire ceramic body 1, along with the inner surfaces of the resonator bores 1, is provided with a metallizing. Since the coupling voids 3 are covered by the ceramic platelets 4 they remain free of the metallizing.

Figure 2:
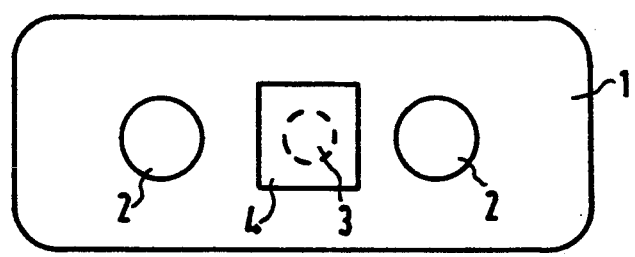
FIG. 2 is a plan view of the filter of FIG. 1.

As was already explained above, the upper end surface, that is the end surface which is visible in FIG. 2, can then be ground so as to be exposed or free.

If structuring is desired, then not all of the raised features produced by the ceramic platelets 4 are removed in this freeing or exposing grinding process.

If additional masks are desired for the metallizings, then ceramic platelets 4 may also be applied to regions of the ceramic body 1 other than at the coupling voids 3, and these regions are then likewise metallized as described above.

It should be pointed out that in the drawing figures the metallizing layers are not separately shown, for the sake of simplicity.

We claim:

1. A process for metallizing monolithic microwave ceramic filters having a ceramic body with an outer surface, resonator bores being formed in the ceramic body and defining surfaces within the resonator bores, and coupling voids being formed in the ceramic body between the resonator bores and defining surfaces within the coupling voids, which comprises covering at least the coupling voids with a ceramic platelet, and subsequently galvanically metallizing the ceramic body to produce a metallizing over at least a portion of the outer surface of the ceramic body and the surfaces within the resonator bores, with the ceramic platelet preventing the surfaces within the coupling voids from receiving a metallizing.

2. The process according to claim 1, which comprises performing the covering step with ceramic platelets being formed of a ceramic having the same dielectric constant as the ceramic body.

3. The process according to claim 1, which comprises applying the ceramic platelets to the coupling voids prior to sintering of the ceramic body and sintering the ceramic platelets together with the ceramic body.

4. The process according to claim 1, which comprises masking the metallizing by additionally applying ceramic platelets to regions of the ceramic body other than at the coupling voids.

5. The process according to claim 1, which comprises grinding at least a portion of the ceramic body free of the metallizing, after performing the metallizing step.

6. The process according to claim 1, which comprises grinding an end surface of the ceramic body free of the metallizing, after performing the metallizing step.

* * * * *